United States Patent [19]

Haynes et al.

[11] Patent Number: 5,578,937
[45] Date of Patent: Nov. 26, 1996

[54] INSTRUMENT FOR ANALYSIS OF ELECTRIC MOTORS BASED ON SLIP-POLES COMPONENT

[75] Inventors: Howard D. Haynes, Knoxville; Curtis W. Ayers, Clinton; Donald A. Casada, Knoxville, all of Tenn.

[73] Assignee: Martin Marietta Energy Systems, Inc., Oak Ridge, Tenn.

[21] Appl. No.: 414,679

[22] Filed: Mar. 31, 1995

[51] Int. Cl.⁶ .................................................. G01R 23/16
[52] U.S. Cl. ........................... 324/772; 318/245; 318/490
[58] Field of Search ............................ 324/772; 318/245, 318/490

[56] References Cited

U.S. PATENT DOCUMENTS 4,527,101 7/1985 Zavis et al. ............................ 318/245
4,965,513 10/1990 Haynes et al. .......................... 324/158
4,978,909 12/1990 Hendrix et al. ......................... 324/77 B Primary Examiner—Kenneth A. Wieder
Assistant Examiner—Barry C. Bowser
Attorney, Agent, or Firm—James M. Spicer; Harold W. Adams

[57] ABSTRACT

A new instrument for monitoring the condition and speed of an operating electric motor from a remote location. The slip-poles component is derived from a motor current signal. The magnitude of the slip-poles component provides the basis for a motor condition monitor, while the frequency of the slip-poles component provides the basis for a motor speed monitor. The result is a simple-to-understand motor health monitor in an easy-to-use package. Straightforward indications of motor speed, motor running current, motor condition (e.g., rotor bar condition) and synthesized motor sound (audible indication of motor condition) are provided. With the device, a relatively untrained worker can diagnose electric motors in the field without requiring the presence of a trained engineer or technician.

8 Claims, 3 Drawing Sheets

INSTRUMENT FOR ANALYSIS OF ELECTRIC MOTORS BASED ON SLIP-POLES COMPONENT

GOVERNMENT RIGHTS STATEMENT

This invention was made with Government support under contract DE-AC05-840R21400 awarded by the U.S. Department of Energy to Martin Marietta Energy Systems, Inc., and the Government has certain rights in the invention.

FIELD OF THE INVENTION

The present invention relates to methods for diagnosing ac induction motors, and more particularly to an instrument based on the slip-poles component for providing simple indications of motor speed, motor running current, motor condition (e.g., rotor bar condition) and an audible indication of motor condition.

BACKGROUND OF THE INVENTION

Electric motors typically undergo mechanical and electrical degradation with use. A common occurrence with ac induction motors is rotor related failures, such as rotor bar degradation or rotor eccentricity. Motor sound, vibration, tachometers, temperature and other means have been used to detect operating motor condition.

In the case of tachometers, some tachometers require contact with the motor shaft. Others, such as photo-tachometers and stroboscope tachometers, require close proximity to the motor, and also require that a portion of the motor shaft be exposed. Many motors, however, are located in inaccessible locations or operate in hazardous environments. Personnel safety may often preclude the monitoring of certain motors even when it otherwise would be desirable. Many motors, even if accessible, do not provide an exposed shaft due to their mounting configurations. For example, many compressors used in air conditioning and refrigeration equipment are coupled to their motors inside a sealed compartment thus preventing motor speed measurements by all commercially available tachometers.

Recent improvements in the diagnostics of electric motors and loads have included the development of motor current signature analysis systems. These systems usually employ a spectrum analyzer, and may obtain the motor current from a current probe clamped over the electrical leads to the motor.

An important advantage of motor current systems is that they permit the motor and load sensing to be done remotely, even at some distance from the actual motor under test. All that is needed is access to the motor leads. Oak Ridge National Laboratory patents such as U.S. Pat. No. 4,965,513 (to Haynes and Eissenberg) and U.S. Pat. No. 4,978,909 (to Hendrix and Smith) pioneered the field of motor current signature analysis.

Commercially available motor diagnostic systems include MotorCheck™ from Computational Systems Incorporated (CSI) and MotorMonitor™ from Entek Scientific Corporation. Both MotorCheck™ and MotorMonitor™ are computer-based motor current monitoring systems that diagnose the condition of an ac-powered electric induction motor by examining the slip-pole sidebands, or "fault frequencies" in the raw motor current frequency spectrum. While such systems can effectively identify degraded motors, their cost and complexity are disadvantages to their widespread use. The commercial systems are generally expensive (costing >$10,000), and require a trained operator.

The subject invention differs from the above commercial systems in several material respects. First, the commercial systems monitor sideband amplitudes, typically sidebands of the 60 Hz line frequency. The subject invention does not use sideband measurements at all, but relies instead on demodulating the ac current to isolate a slip-poles component which becomes the basis for all the subsequent circuits of the invention. A second difference is that the invention is intended for quick on-the-spot motor diagnoses by relatively untrained observers. The commercial systems, on the other hand, are best suited for use by highly trained engineers or technicians whose objective is to obtain detailed motor analyses. Thirdly, the subject invention provides a remote tachometer, which is also based on the slip-poles component. Additionally, the commercial systems are computer-based fast fourier transform analysis systems, whereas the subject invention is an analog-based hand-held instrument.

The instrument, in other words, has as one object to be capable of use by relatively unskilled observers to quickly identify those motors that may be in the process of failing. Later, one of the more expensive motor current diagnostic systems could be used to more accurately assess the condition of any motors that were found to be suspect.

Another object is to provide a small, inexpensive, simple-to-use, and easy-to-understand remote motor monitor and tachometer.

Another object is to provide simple indications of motor speed, motor running current, motor condition (e.g., rotor bar condition) and an audible indication of motor condition based on the magnitude of the conditioned slip-poles component. This can be packaged in one small instrument without the need for expensive computer-based or spectrum-analyzer-based instrumentation.

Still another object of the invention is to enable a relatively untrained worker to diagnose an electric motor in the field without requiring the presence of a trained engineer or technician.

SUMMARY OF THE INVENTION

These and other objects are achieved by the present invention which provides a method for diagnosing an ac induction motor. The invention includes the steps of sensing the ac current drawn by the motor, converting the ac current signal to an ac voltage signal, demodulating the ac voltage signal to obtain a slip-poles component, band-pass filtering the signal to enhance the slip-poles component of the voltage signal, analyzing the magnitude of the slip-poles component to obtain motor condition information, and analyzing the frequency of the slip-poles component to obtain motor speed information.

DESCRIPTION OF THE PREFERRED EMBODIMENT

The invention accomplishes two major functions: remote motor condition monitoring and remote motor speed monitoring. Both functions are based on the slip-poles component of a demodulated motor current signal.

Figure 1:
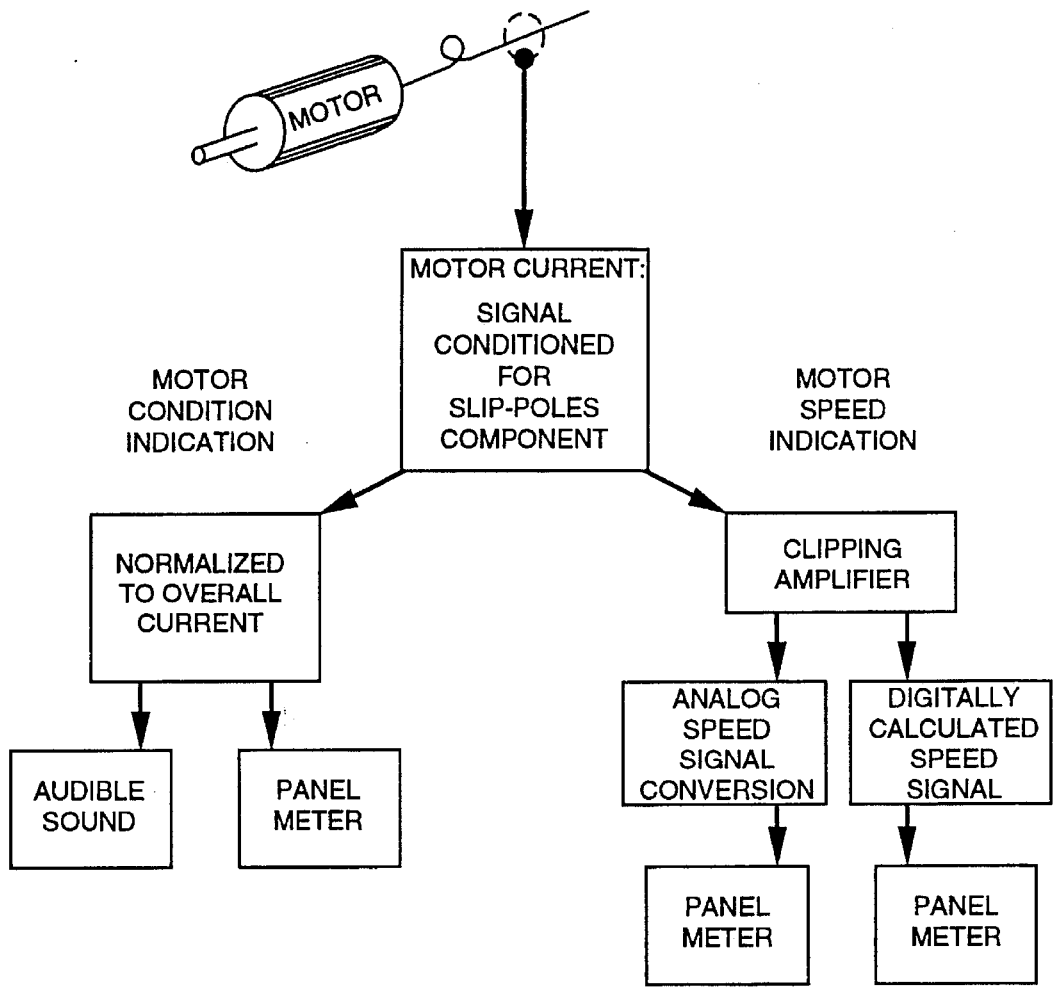
FIG. 1 is a block diagram showing the overall system concept.

The diagram in FIG. 1 describes a general flow path where the slip-poles component is manipulated to achieve basically four end results. The motor condition monitoring segment concentrates on utilizing the magnitude of the slip-poles component, normalized to overall current. A specially conditioned sound output can be produced from this segment of the system with output to a speaker or headphones. The normalized magnitude of the slip-poles component can be displayed on a panel meter. The motor speed segment of FIG. 1 focuses on the frequency of the component, and describes an analog speed signal conversion method and a digitally calculated speed, both of which can be fed to some form of panel meter. These running speed parameters can be displayed in hertz or alternately in rpm, depending on the user's preference.

Figure 2:
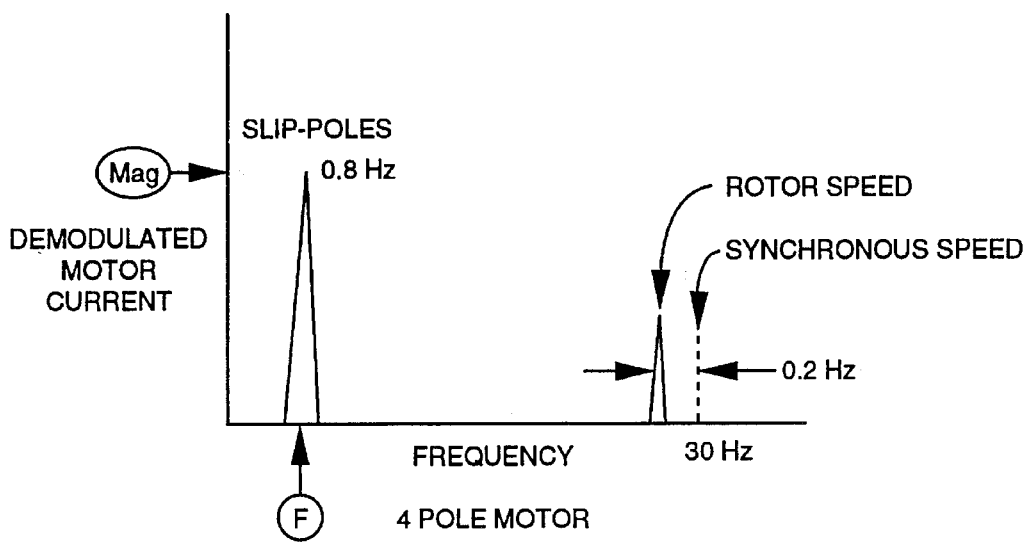
FIG. 2 is a graph of demodulated motor current vs frequency illustrating the slip-poles component.

FIG. 2 is a graph of demodulated motor current vs frequency for a 4-pole motor illustrating the slip-poles component. Synchronous speed for a 4-pole induction motor is 30 Hz (1800 rpm) which is the frequency of the rotating magnetic field in the stator. The actual rotor speed (29.8 Hz) lags the synchronous speed by an amount called the slip frequency, equal to 0.2 Hz in this example.

In FIG. 2, there is a low frequency component that varies in magnitude depending on the condition of the motor. This low frequency component also varies in frequency according to the motor speed. This low frequency component is a product of the number of motor poles times the motor slip frequency. In the four-pole motor of FIG. 2, this component is shown at 0.8 Hz. Multiplying the amount of slip (0.2 Hz) times the number of poles in the motor gives the "slip-poles frequency" (4 times 0.2 or 0.8 Hz).

The advantage of using the slip-poles frequency is that if the motor speed were to vary by only 0.1 Hz, the slip-poles frequency would vary by 0.4 Hz, four times the amount of the motor's speed. The slip poles is thus a more sensitive measure of speed than the motor speed itself. The motor speed component is usually a very small component in the spectrum, and therefore not as easily detectable.

Figure 3:
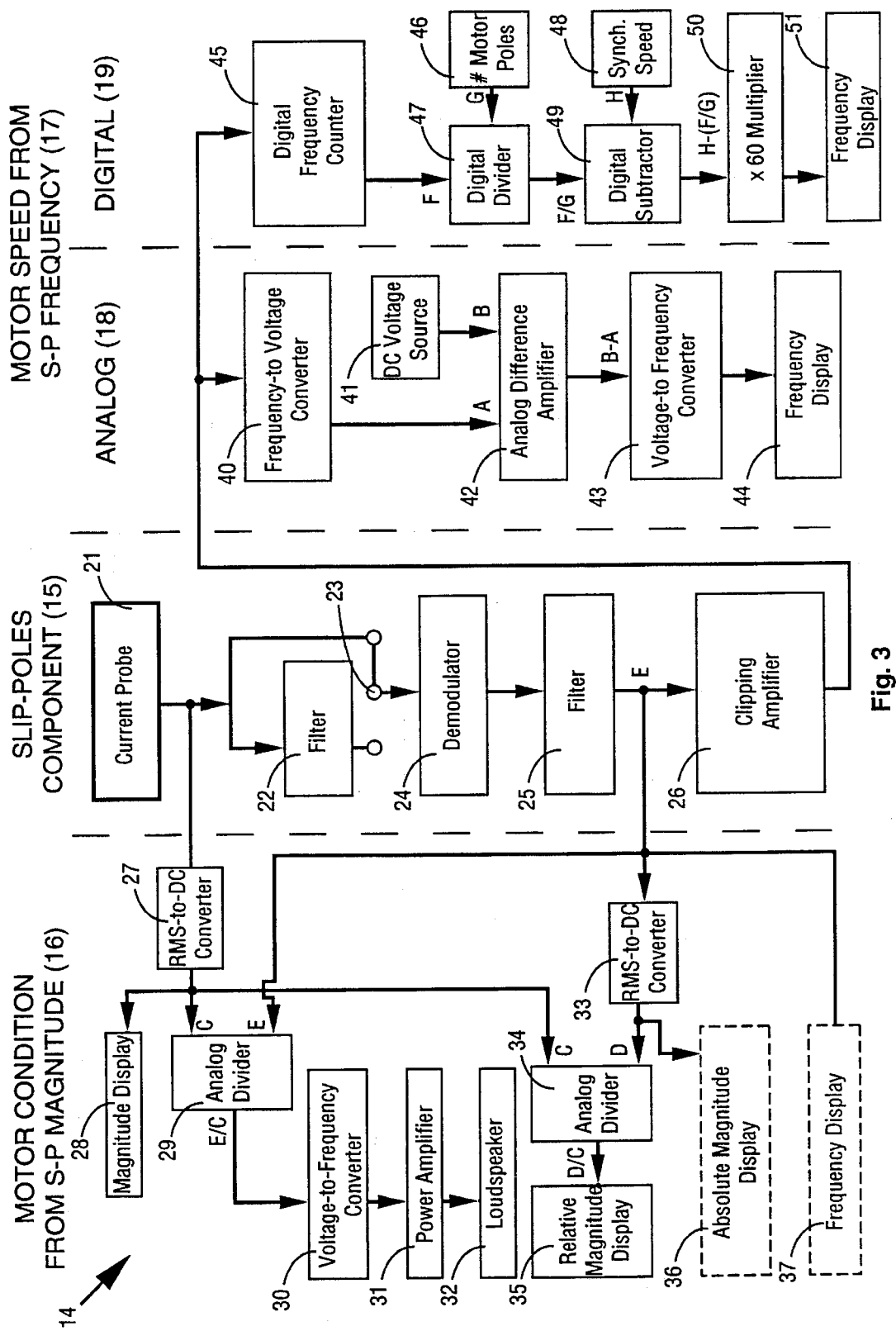
FIG. 3 is a block diagram of the preferred embodiment of the invention.

In FIG. 3, a clamp-on current probe 21 is placed around the motor's electrical power lead in order to acquire the raw ac current signal from the motor. The ac current signal sensed by the probe is then converted to an ac voltage signal by a shunt resistor (not shown). Also as is known, the ac voltage signal representative of the motor's ac current can be converted to a dc voltage signal (at C) by an rms-to-dc converter 27 and displayed 28. Wherever "display" occurs in the specification, it is to be understood that any form of suitable analog device, dial gauge or digital gauge may be used as the actual display device as desired.

Again in FIG. 3, the raw ac voltage signal from the current probe 21 is demodulated in demodulator 24 to obtain a strong motor slip-poles component. A switch 23 may cause a high-pass filter, band-pass filter, or notch filter 22 to be utilized prior to demodulation to increase the sensitivity to motor frequency components and decrease the sensitivity to mechanical components, e.g., gear meshing, belt turning, etc. The slip-poles component is further cleaned-up by filtering in a band-pass filter 25 to remove unwanted noise from the electrical signal. The conditioned slip-poles component can be optionally displayed in display 37.

Two major circuit branches utilize the slip poles component. These are the motor condition circuit 16 and the motor speed circuit 17. The motor condition circuit 16 is based on the magnitude of the slip-poles component, while the motor speed circuit 17 is based on the frequency of the slip-poles component.

Motor Condition Circuit

In the motor condition circuit 16, the conditioned slip-poles frequency signal E is first normalized to the dc voltage (C) derived from the total motor current signal. This is accomplished with the analog dividers 29 and 34. The purpose of normalizing is to make the instrument usable on a wide variety of motors, yet produce outputs that are nominally the same from motor to motor.

In FIG. 3, in more particular detail, the conditioned slip-poles frequency signal E is normalized in analog divider 29 by the total rms current signal C obtained from rms-to-dc converter 27. This provides a signal magnitude (effectively the magnitude of the slip-poles component) that corresponds to the motor rotor bar condition, and which takes into account the total running current of the motor being tested. This signal, E/C, is then converted to audible sound by a voltage-to-frequency converter (VFC) 30, power amplifier 31 and loudspeaker 32. In an alternate embodiment, a voltage controlled frequency (VCF) signal generator may be used in place of the voltage-to-frequency converter 30. VFC 30 has a gain adjustment for adjusting the sound from loudspeaker 32. VFC 30 can be adjusted, for example, such that no sound is heard when the tested motor is in good condition (i.e., the slip-poles frequency signal is small in magnitude), and very distinctive (e.g., loud chirps), when the tested motor is in degraded condition (e.g., broken rotor bars). The sound, or lack thereof, provides the user with an immediate indication on the general state of the motor. This feature alone makes it easier for some people to check their motors.

Still in FIG. 3, the conditioned slip-poles frequency signal E is also converted to adc signal D by rms-to-dc converter 33, and optionally displayed at 36. The signal D is normalized in analog divider 34 by the total rms current signal C, and the resulting signal D/C is displayed 35 as the slip-poles magnitude. Display 35 quantifies the motor's general condition, and can be used to identify and estimate the number of broken rotor bars in the motor.

Motor Speed Circuit

Continuing in FIG. 3, the motor speed circuit 17 is next described. For the motor speed circuit 17, the conditioned slip-poles frequency signal E is altered by a clipping amplifier 26 which may be an over-driven amplifier. Clipping amplifier 26 converts the sinusoidal waveform of signal E to a square wave or pulse train. By this means, the amplitude variations of the slip-poles frequency signal E are removed, leaving only the frequency variations going to the motor speed circuit 17.

Following dipping amplifier 26, the frequency of the pulse train is further processed by the analog motor speed circuit 18 or the digital motor speed circuit 19.

In analog circuit 18, an adjustable gain frequency-to-voltage converter 40 converts the frequency of the pulse train to a voltage level A which is subtracted in analog difference amplifier 42 from a preset dc voltage B from dc voltage source 41. The purpose for this subtraction is as follows: the frequency of the slip-poles signal E varies inversely with the speed of the motor according to the equation:

Slip-Poles Frequency in Hz=[(Synchronous Motor Speed in Hz)–

(Actual Motor Speed in Hz)|×(Number of Motor Poles).

By converting the slip-poles frequency signal E to a voltage A and then subtracting this voltage from a larger voltage B, the resulting voltage difference B-A increases with increasing motor speed and decreases with decreasing motor speed. The voltage difference signal B-A is then converted back to a frequency signal by an adjustable gain voltage-to-frequency converter VFC 43, resulting in a frequency signal that changes directly with the motor speed. With the frequency signal properly calibrated by gain adjustments in the VFC and in the dc voltage source, for example, it is displayed in display 44 as motor speed in RPM (or left in hertz if the user desires).

In digital circuit 19, a digital frequency counter 45 determines the slip-poles frequency as a pure number. This number is divided in digital divider 47 by the number of motor poles 46 as previously described. The result F/G is subtracted in digital subtractor 49 from the motor's synchronous speed 48. Lastly, the signal is multiplied in multiplier 50 by 60 in order to convert it from Hz to RPM for display at 51 (or left in hertz if the user desires).

Either the analog signal conditioning circuit 18 or the digital signal conditioning circuit 19 may be used in this invention. There may be advantages to providing both circuits in the same instrument, especially if analog and digital outputs aid the motor diagnosis.

Figure 4:
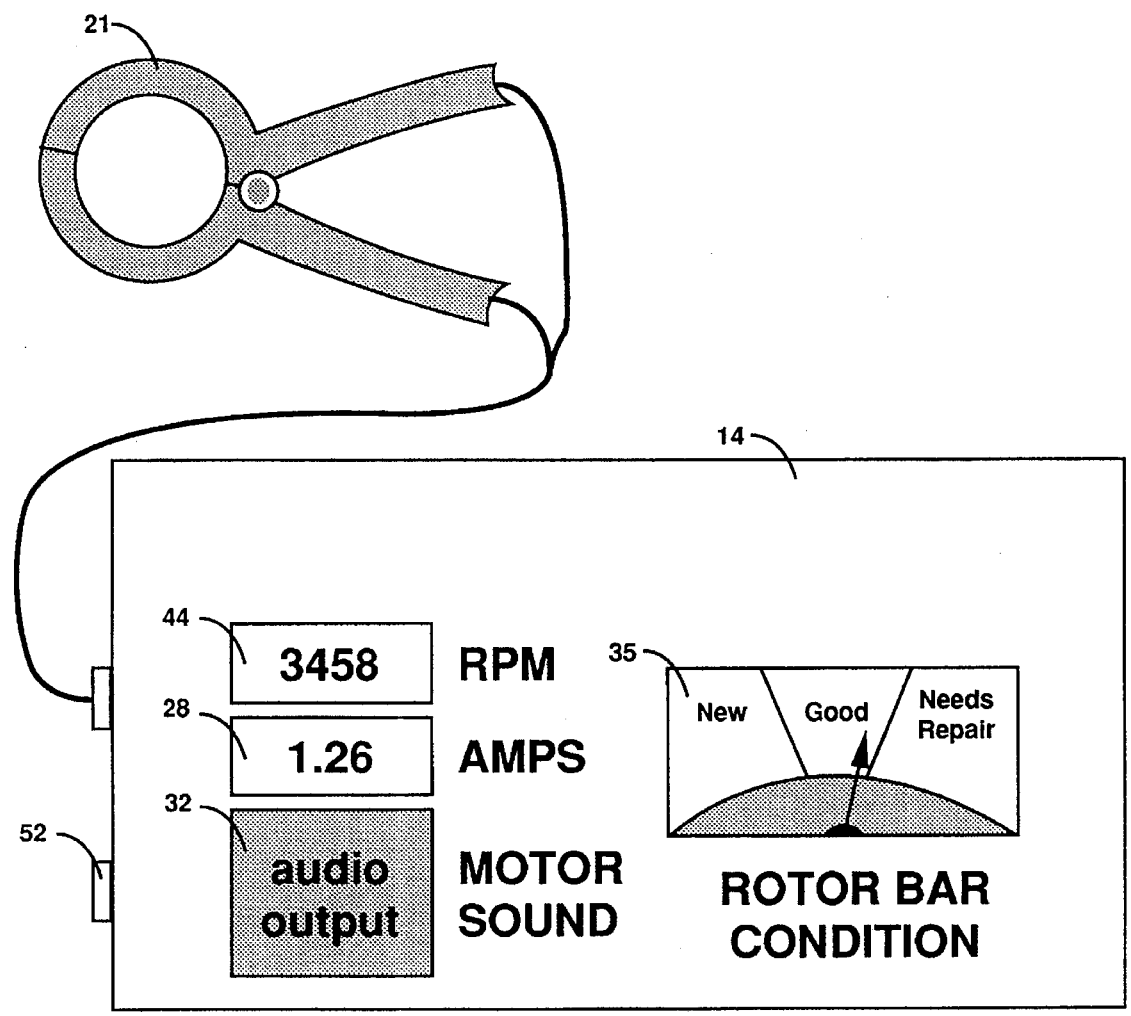
FIG. 4 shows one manner of embodying the subject invention.

FIG. 4 illustrates one possible embodiment of this invention. The circuit 14 can be packaged in a box small enough to be carried in one hand. Thus, the clamp-on probe 21 could be made integral with the case, or could be attached to the box with leads as shown. The displays shown in FIG. 4 include:

Motor speed in RPM—Display 44

Motor Running Current in amps—Display 28

Motor Condition, e.g., rotor bar condition—Display 35

Motor Condition, i.e., audible Loudspeaker 32

Note the two different displays for the motor condition. Other or different displays, as previously described, could be provided as well. A headphone jack 52 allows listening to motor sound in high ambient noise environments. Additional output jacks could be provided for connection to tape recorders, oscilloscopes, spectrum analyzers, etc.

The invention has advantages over expensive motor diagnostic systems and traditional tachometers due to its non-intrusiveness, low cost, and ease of use. It can be constructed for less than $400 compared to approximately $10,000 for both a tachometer and a motor diagnostic system. It requires little or no training to use. Present commercial systems are more complicated and are intended for much more detailed spectral analysis. The vendors may also provide training courses, at additional cost to the user.

The invention should be useful as a motor condition, process efficiency, and motor speed monitor for a large variety of motor-driven devices including pumps, fans, blowers, compressors, water chillers, etc.

In modified versions, the invention may also be used to monitor linear velocity (e.g., inches per second) of a conveyor belt when the relationship between motor shaft speed and conveyor belt speed is known (determined from gear and/or pulley ratios). Similarly, fluid flow rate (e.g., gallons per minute, cubic feet per minute) through pumps and fans could also be monitored knowing the flow vs. speed characteristics of these devices.

I claim:

1. A method for diagnosing an ac induction motor comprising the steps of:

sensing the ac current drawn by said motor;

converting said ac current signal to an ac voltage signal;

demodulating said ac voltage signal to obtain a slip-poles component;

band-pass filtering said demodulated ac voltage signal to enhance said slip-poles component of said demodulated ac voltage signal;

analyzing the magnitude of said enhanced slip-poles component to obtain motor condition information; and analyzing the frequency of said enhanced slip-poles component to obtain motor speed information.

2. The method of claim 1 comprising the further steps of:

converting said ac current to a dc voltage; and displaying said dc voltage.

3. The method of claim 2 wherein said analyzing the magnitude of said slip-poles component includes the step of normalizing said enhanced slip-poles component to said dc voltage.

4. The method of claim 3 wherein said analyzing the magnitude of said slip-poles component includes the further step of converting said normalized enhanced slip-poles component to audible sound.

5. The method of claim 3 wherein said analyzing the magnitude of said slip-poles component includes the further step of displaying the magnitude of said normalized enhanced slip-poles component.

6. The method of claim 1 wherein said analyzing the frequency of said slip-poles component includes the steps of:

digitally converting said enhanced slip-poles component to a pure number by digital frequency counter means;

dividing said pure number by the number of motor poles to obtain a resulting slip number;

subtracting said slip number from the synchronous speed of said motor to obtain a difference; and displaying said difference as motor speed.

7. The method of claim 1 wherein said analyzing the frequency of said enhanced slip-poles component includes the steps of:

converting said enhanced slip-poles component to a voltage level;

subtracting said voltage level from a larger preset dc voltage to obtain a voltage difference signal;

converting said voltage difference signal to a frequency signal; and displaying said frequency signal as motor speed.

8. The method of claim 1 comprising the further step of filtering said ac voltage signal before said demodulating said ac voltage signal.

* * * * *